United States Patent
Oguchi et al.

(10) Patent No.: US 10,321,596 B2
(45) Date of Patent: Jun. 11, 2019

(54) JOB-SITE ELECTRIC APPARATUS AND METHOD FOR REDUCING INVASION OF FOREIGN MATTER INTO JOB-SITE ELECTRIC APPARATUS

(71) Applicant: MAKITA CORPORATION, Anjo-shi, Aichi (JP)

(72) Inventors: Kazuki Oguchi, Anjo (JP); Goshi Ishikawa, Anjo (JP); Nobuaki Kawatani, Tokyo (JP)

(73) Assignee: MAKITA CORPORATION, Anjo-shi (JP)

( * ) Notice: Subject to any disclaimer, the term of this patent is extended or adjusted under 35 U.S.C. 154(b) by 0 days.

(21) Appl. No.: 15/718,589

(22) Filed: Sep. 28, 2017

(65) Prior Publication Data

US 2018/0098445 A1 Apr. 5, 2018

(30) Foreign Application Priority Data

Sep. 30, 2016 (JP) .................................. 2016-195186

(51) Int. Cl.
| | |
|---|---|
| H05K 5/06 | (2006.01) |
| H01R 13/52 | (2006.01) |
| H01R 33/965 | (2006.01) |
| H05K 5/02 | (2006.01) |
| H05K 5/00 | (2006.01) |
| G01C 15/00 | (2006.01) |
| G01D 11/24 | (2006.01) |

(52) U.S. Cl.
CPC ............ *H05K 5/069* (2013.01); *G01C 15/00* (2013.01); *G01D 11/24* (2013.01); *H01R 13/5205* (2013.01); *H01R 13/5219* (2013.01); *H01R 33/965* (2013.01); *H05K 5/0086* (2013.01); *H05K 5/023* (2013.01); *H05K 5/0217* (2013.01); *H05K 5/0247* (2013.01); *G01C 15/004* (2013.01)

(58) Field of Classification Search
CPC ... H05K 5/069; H01R 13/5205; H01R 33/965
See application file for complete search history.

(56) References Cited

U.S. PATENT DOCUMENTS

| 7,862,373 B2* | 1/2011 | DeMay ............... H01R 13/5202 439/587 |
| 2008/0196912 A1* | 8/2008 | Gass ..................... B23B 31/123 173/4 |

(Continued)

FOREIGN PATENT DOCUMENTS

JP 5962325 B2 8/2016

*Primary Examiner* — William H. Mayo, III
*Assistant Examiner* — Hiram E Gonzalez
(74) *Attorney, Agent, or Firm* — Oliff PLC

(57) ABSTRACT

A job-site electric apparatus in one aspect the present disclosure includes a housing, an operation device, a terminal, a separator, a coupling device, and a sealing portion. The separator is configured to separate the housing into a first area and a second area, and includes a through hole that allows communication between the first area and the second area. The first area includes the operation device. The second area includes the terminal. The coupling device passes through the through hole and electrically couple the terminal to the operation device. The sealing portion seals the through hole through which the coupling device passes.

15 Claims, 9 Drawing Sheets

(56) References Cited

U.S. PATENT DOCUMENTS

2012/0073847 A1* 3/2012 Nagasaka ................. B25F 5/02
          173/217
2012/0292070 A1* 11/2012 Ito .......................... H02K 5/225
          173/217
2015/0223652 A1* 8/2015 Koura ..................... A47L 5/365
          15/327.2

* cited by examiner

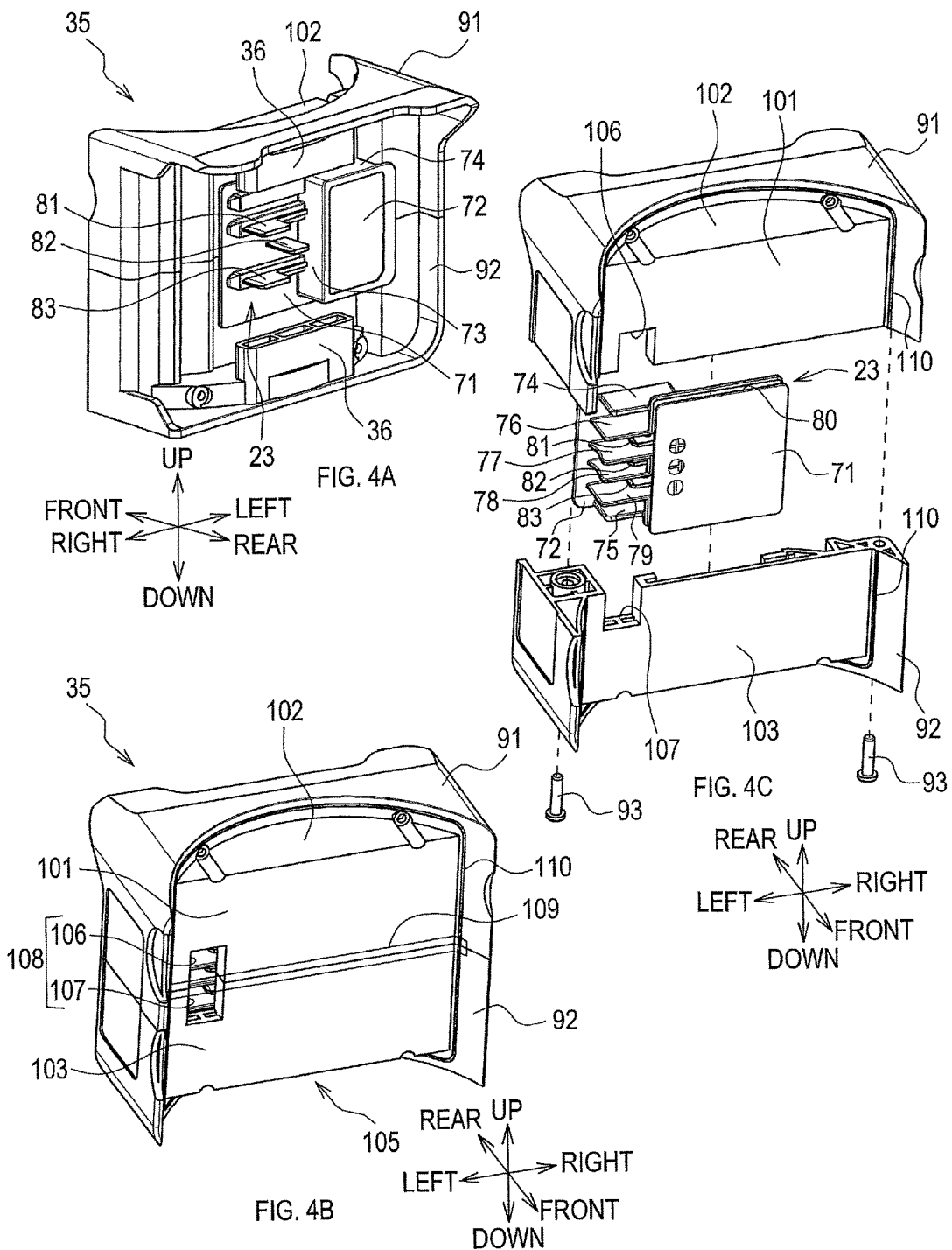

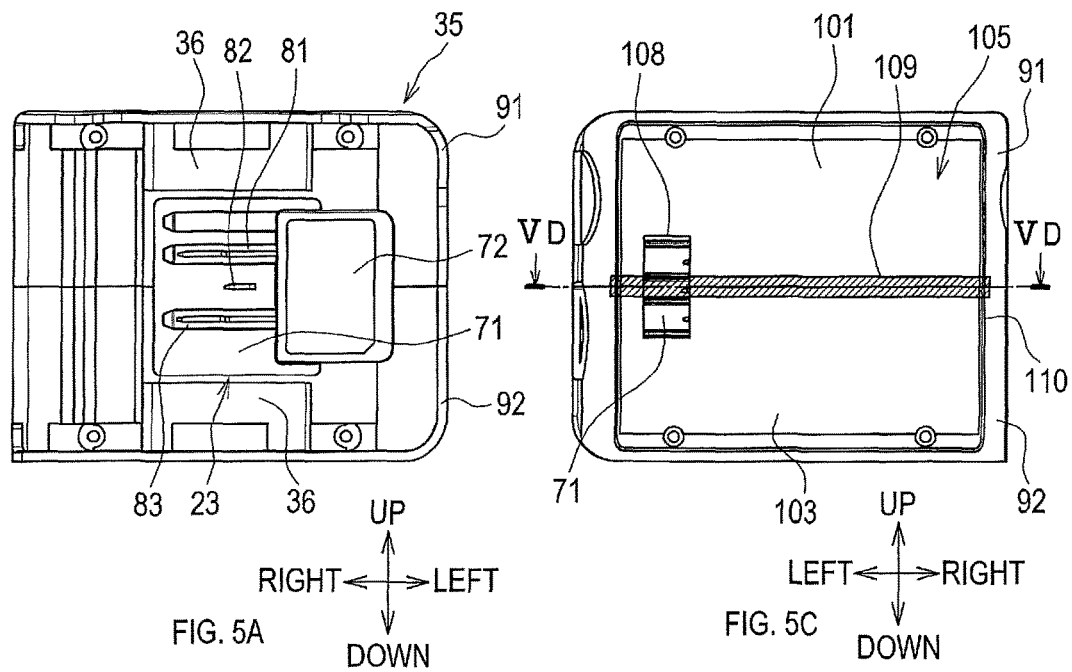
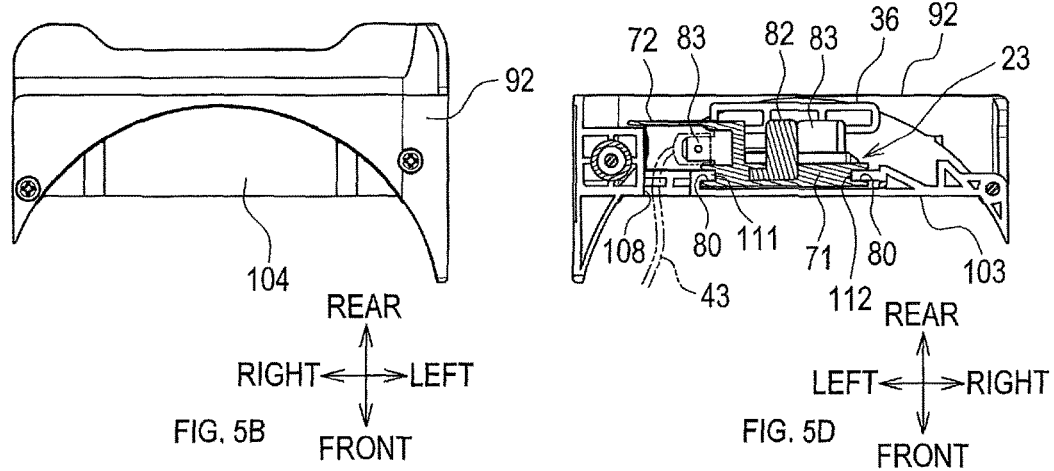

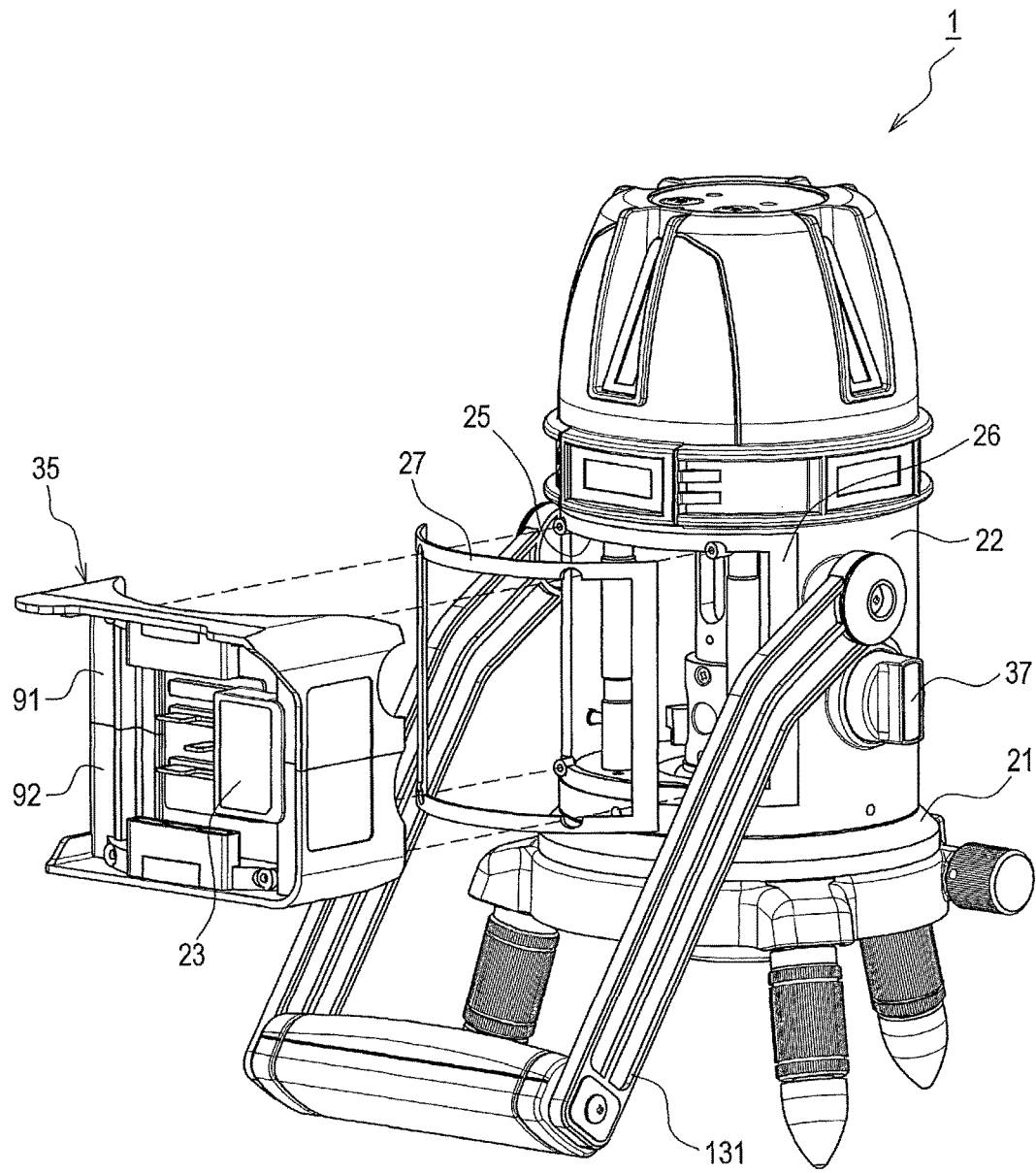
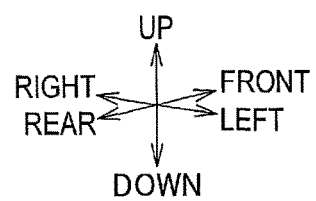
FIG. 6

JOB-SITE ELECTRIC APPARATUS AND METHOD FOR REDUCING INVASION OF FOREIGN MATTER INTO JOB-SITE ELECTRIC APPARATUS

CROSS-REFERENCE TO RELATED APPLICATIONS

This application claims the benefit of Japanese Patent Application No. 2016-195186 filed on Sep. 30, 2016 with the Japan Patent Office, the entire disclosure of which is incorporated herein by reference.

BACKGROUND

The present disclosure relates to a job-site electric apparatus.

There are known job-site electric apparatuses in which a battery pack attachable to and detachable from a housing is employed as a power source. In some cases, an attachment/detachment portion for the battery pack in the housing includes a terminal holder having one or more terminals for receiving power supply from the battery pack. It is preferable that a configuration to retain the terminal holder be capable of reducing invasion of foreign matter, such as water and dust, into the housing.

In an example disclosed in Japanese Patent No. 5962325, a sealing member is mounted around the terminal holder, and the terminal holder is held by the housing.

SUMMARY

The aforementioned example is not always optimal for reducing invasion of foreign matter in view of, for example, dimensional variations during manufacturing and aging deterioration of the sealing member.

In one aspect of the present disclosure, it is preferable to provide a novel technique that enables reduction in invasion of foreign matter into a job-site electric apparatus.

A job-site electric apparatus in one aspect of the present disclosure includes a housing, an operation device, a terminal, a separator, a coupling device, and a sealing portion. The operation device is configured to operate by receiving supply of electric power. The terminal is configured to receive supply of the electric power from a battery pack. The separator is configured to separate the housing into a first area and a second area, and includes a through hole that allows communication between the first area and the second area. The first area includes the operation device, and the second area includes the terminal. The coupling device is configured to pass through the through hole and electrically couple the terminal to the operation device. The sealing portion is configured to seal the through hole through which the coupling device passes.

According to the job-site electric apparatus as described above, since the housing is separated into the first area and the second area by the separator, and the through hole of the separator is sealed with the sealing portion, invasion of foreign matter from the second area to the first area can be reduced.

The job-site electric apparatus may include a terminal holder configured to hold the terminal. The housing may be configured to retain the operation device and the terminal holder. The terminal holder may be configured to cover a part of the terminal.

The housing may include a retainer configured to retain the terminal holder at a specified position. The terminal holder may be mounted to the housing by being retained by the retainer.

In this case, the terminal holder can be retained at the specified position in the housing by the retainer.

The separator may include a combination of a plurality of components. The retainer may include a plurality of members. Each member of the plurality of members may be provided to one component of the plurality of components. The plurality of members may be combined to retain the terminal holder at the separator formed by the combination of the plurality of components.

In this case, the terminal holder can be retained in the housing by the plurality of members.

The terminal holder may be mounted to the housing with some freedom of movement.

In this case, the terminal holder is not completely fixed to the housing but is movable within a small range. Accordingly, when the terminal of the terminal holder and a terminal of the battery pack contact each other, it is possible to reduce application of an excessive load to the terminal of the terminal holder and/or to the terminal of the battery pack.

The coupling device may include a deformable part. The deformable part may include a part of a section from the sealing portion to the terminal of the terminal holder.

In this case, obstruction of movement of the terminal holder by the coupling device can be reduced.

The housing may include a mounting portion configured to attachably and detachably hold the battery pack.

In this case, the battery pack can be attached at a specified position.

The housing may include a cylindrical portion having a substantially cylindrical shape. The separator may be provided in the housing such that, when the housing is projected onto a plane having a normal that coincides with an axis of the cylindrical portion, a part of the separator is positioned inside the cylindrical portion.

In this case, since the part of the separator is positioned inside the cylindrical portion, the terminal holder can be arranged at a position close to the center of the cylindrical portion.

Another aspect of the present disclosure provides a method for reducing invasion of foreign matter into a job-site electric apparatus. The method includes: providing a separator in a housing of the job-site electric apparatus so as to separate the housing into a first area and a second area, the first area including an operation device of the job-site electric apparatus configured to operate by receiving supply of electric power, the second area including a terminal configured to receive supply of electric power from a battery pack, and the separator including a through hole that allows communication between the first area and the second area; electrically coupling the terminal to the operation device through the through hole; and sealing the through hole through which the terminal and the operation device are electrically coupled.

Such method can achieve the same effects as in the above described job-site electric apparatus.

BRIEF DESCRIPTION OF THE DRAWINGS

An embodiment of the present disclosure will be described hereinafter by way of example with reference to the accompanying drawings, in which:

FIG. 4A is a perspective view of an attachment portion as viewed from obliquely rearward, FIG. 4B is a perspective view of the attachment portion as viewed from obliquely forward, FIG. 4C is an exploded perspective view of the attachment portion as viewed from obliquely forward;

FIG. 5A is a rear view of the attachment portion, FIG. 5B is a bottom view of the attachment portion, FIG. 5C is a front view of the attachment portion, and FIG. 5D is a VD-VD sectional view of FIG. 5C;

FIG. 6 is a perspective view showing the laser marking device with the attachment portion removed;

DETAILED DESCRIPTION OF THE PREFERRED EMBODIMENTS

1. Embodiment

[1-1. Overall Configuration]

Figure 1:
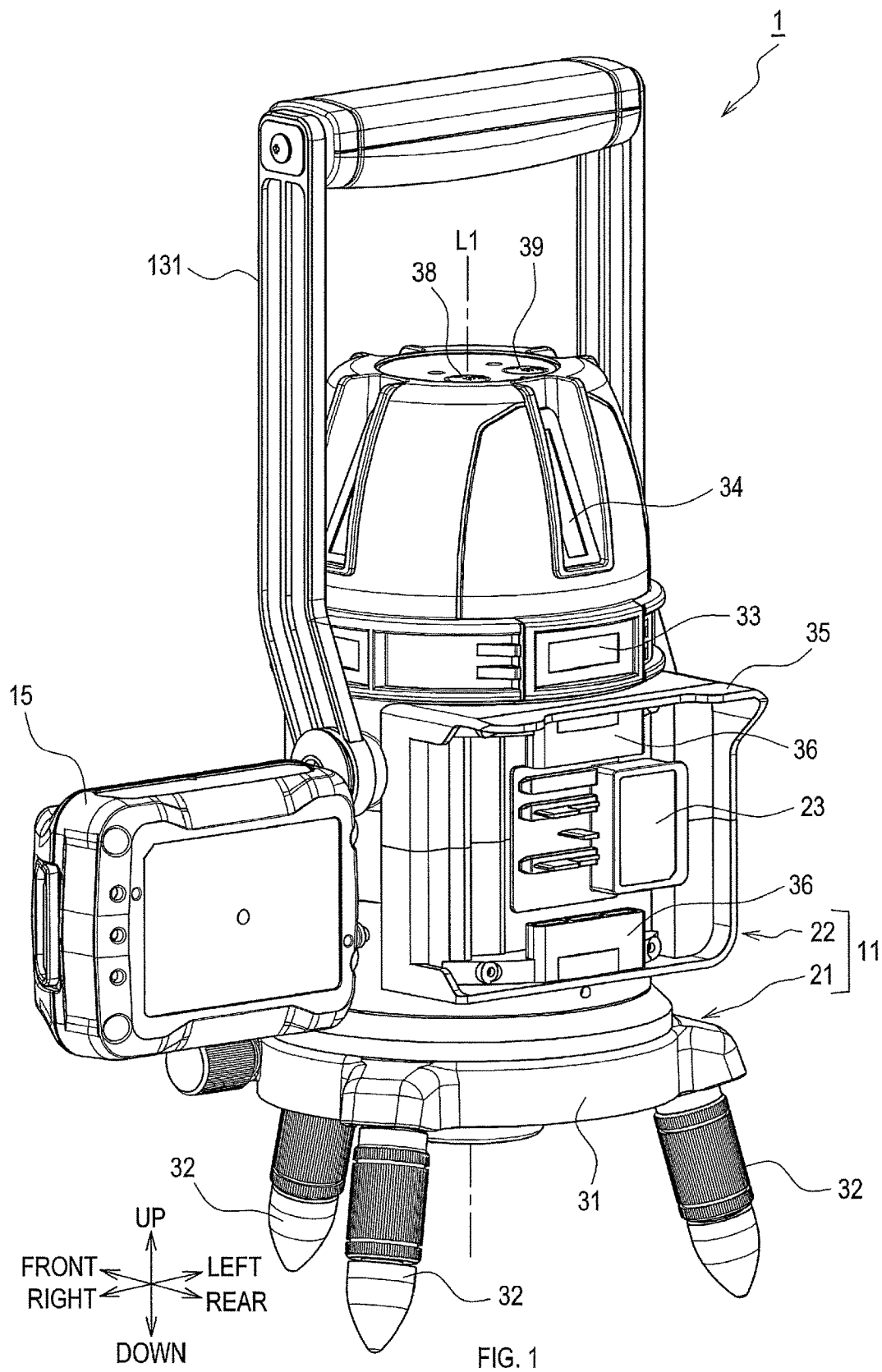
FIG. 1 is a perspective view showing a laser marking device with a battery pack removed.

A laser marking device (or a laser level) 1 of this example embodiment, which is used for civil engineering work, building work, and others, is configured to project a reference line by a laser beam onto a target. The laser marking device 1 is an example of a job-site electric apparatus of the present disclosure.

As shown in FIG. 1 to FIGS. 2A-2D, the laser marking device 1 includes a housing 11, a laser beam generator 13, a battery pack 15, and other components.

Hereinafter, a configuration of the laser marking device 1 may be described using directions of "front and rear," "right and left," and "up and down"; however, these directions are used only for convenience purposes and should not be construed to limit the present disclosure. The up and down directions hereinafter mean up and down directions in an ordinary usage mode of the laser marking device 1. The front and rear directions mean front and rear directions when a side surface of the laser marking device 1, to which the battery pack 15 is mounted, is defined as rear. The right and left directions mean right and left directions when the laser marking device 1 is seen from the front.

[1-2. Housing]

As shown in FIG. 1 and FIGS. 2A-2D, the housing 11 includes a base portion 21 to abut an installation place of the laser marking device 1 and a rotating portion 22 secured on an upper side of the base portion 21 so as to be rotatable around a center axis L1.

The base portion 21 includes a plate portion 31 and three legs 32. The plate portion 31 is a substantially disk-shaped member to rotatably support the rotating portion 22. The legs 32 support the plate portion 31.

Figure 2C:
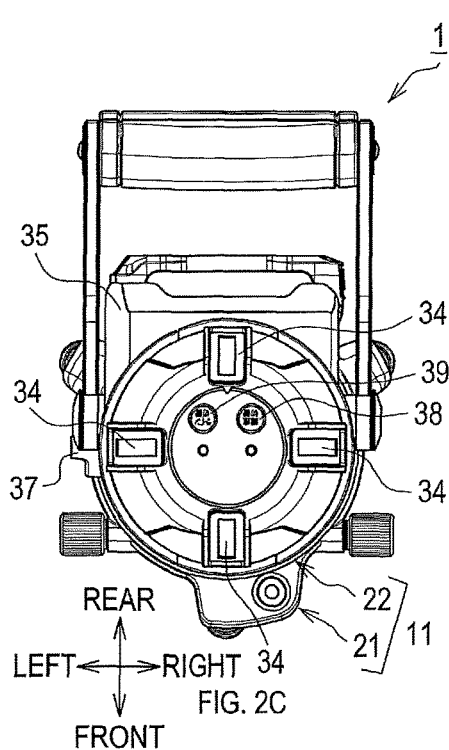
FIG. 2C is a plan view of the laser marking device.
Figure 2D:
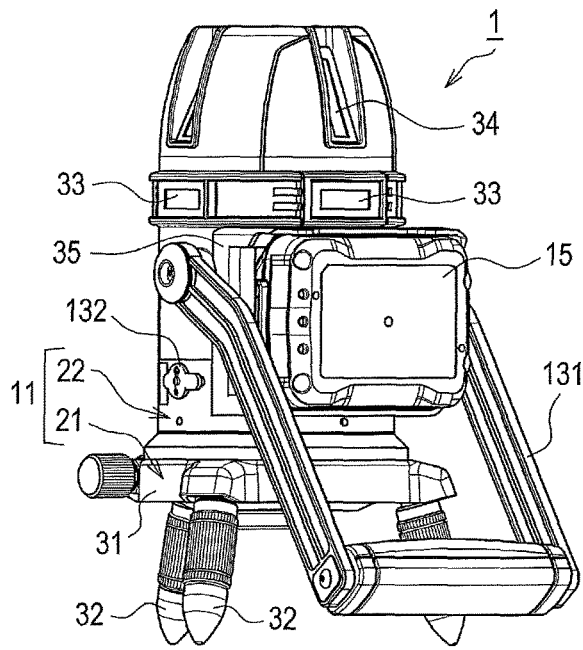
FIG. 2D is a perspective view of the laser marking device.
Figure 2A:
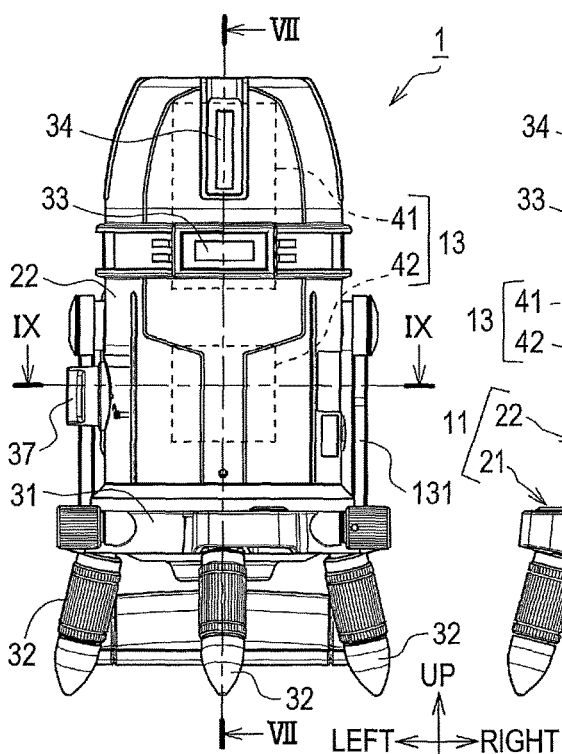
FIG. 2A is a front view of the laser marking device.
Figure 2B:
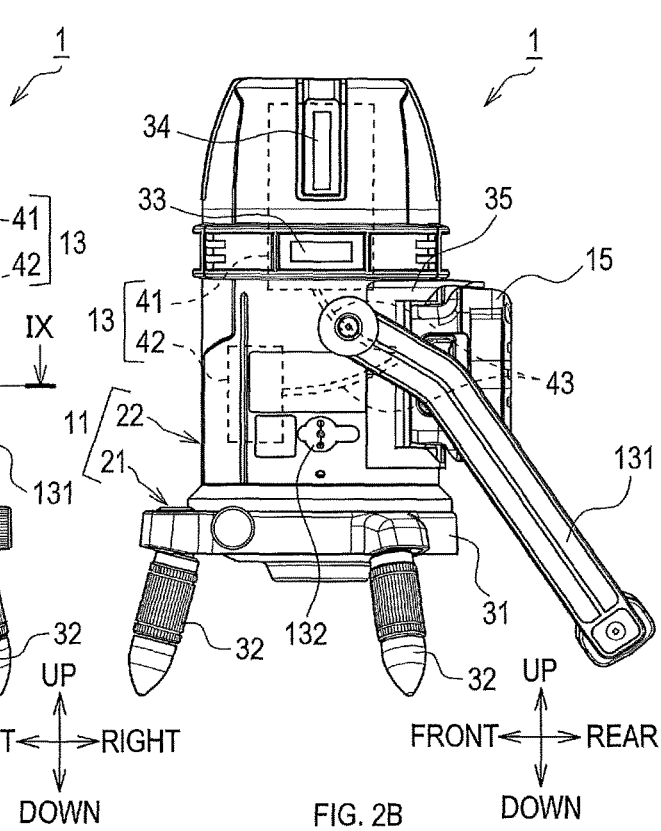
FIG. 2B is a right side view of the laser marking device.
Figure 3D:
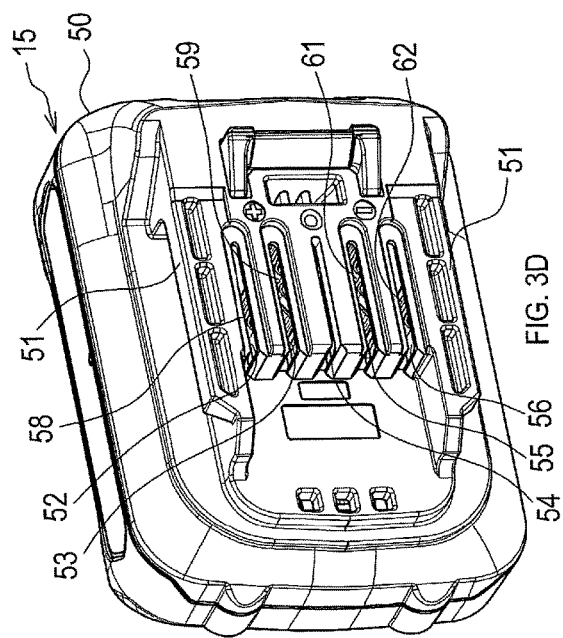
FIG. 3D is a perspective view of the battery pack.
Figure 3B:
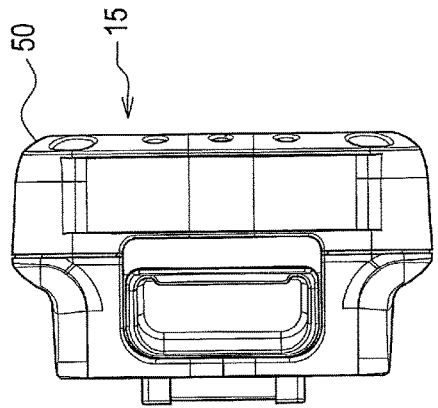
FIG. 3B is a right side view of the battery pack.
Figure 3C:
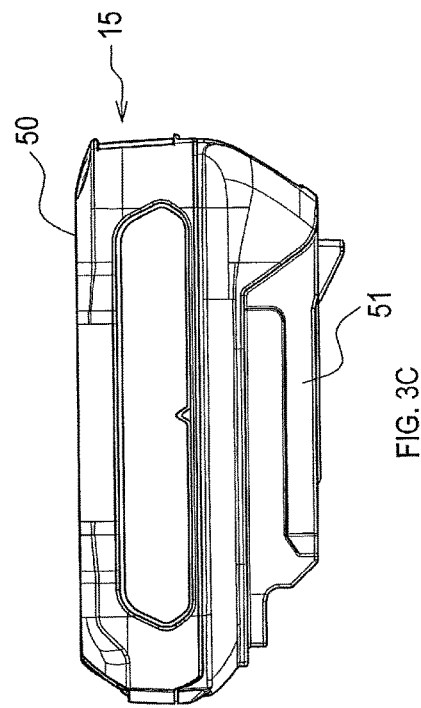
FIG. 3C is a plan view of the battery pack.
Figure 3A:
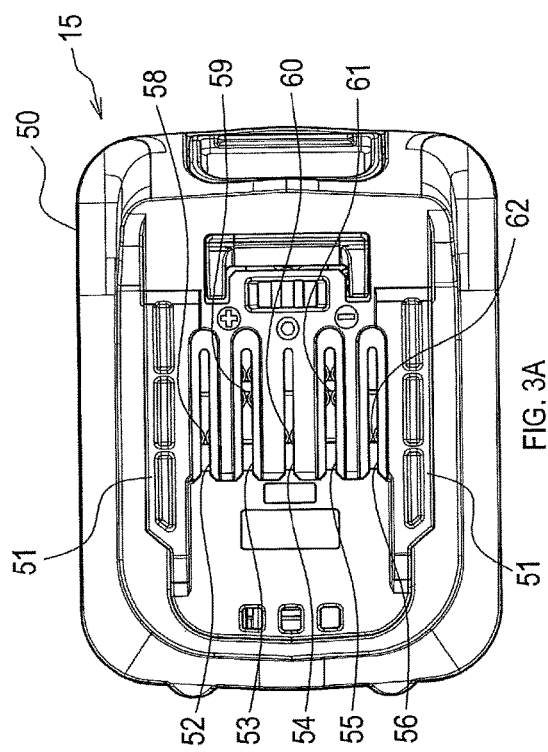
FIG. 3A is a front view of the battery pack.

The rotating portion 22 has a substantially cylindrical shape that extends along the center axis L1, and includes an upper part having a dome-like shape. As shown in FIG. 2A and FIG. 2B, the rotating portion 22 holds therein the laser beam generator 13 that generates a laser beam. As shown in FIG. 1 and other figures, the rotating portion 22 includes four horizontal laser beam emission ports 33 and four vertical laser beam emission ports 34, through each of which a laser beam passes outwardly from within.

The horizontal laser beam emission ports 33 each allow a horizontal laser beam indicating a horizontal reference line to pass through outwardly from inside the housing 11.

The vertical laser beam emission ports 34 each allow a vertical laser beam indicating a vertical reference line to pass through outwardly from inside the housing 11.

The rotating portion 22 also includes on its rear side an attachment portion 35. The attachment portion 35 includes two sliding rails 36 that enable attachment of the battery pack 15 to the housing 11. The attachment portion 35 also includes a terminal holder 23, and the terminal holder 23 includes at least one terminal (two terminals in the present embodiment) that are configured to receive electric power to the laser beam generator 13 from the battery pack 15.

The sliding rails 36 hold the battery pack 15 so as to be attachable to and detachable from the housing 11. Attachment and detachment of the battery pack 15 to and from the housing 11 is achieved by sliding the battery pack 15 along the sliding rails 36. The sliding rails 36 are an example of a mounting portion of the present disclosure. The terminal holder 23 held by the attachment portion 35 will be described in detail later.

The housing 11 includes a power switch 37, mode change switches 38 and 39, a handle 131, an external power source connector 132.

The power switch 37 is provided at a side surface of the rotating portion 22. When a user operates the power switch 37, the laser beam generator 13 is switched between an ON state in which laser beam emission is performed and an OFF state in which laser beam emission is not performed.

The mode change switches 38, 39 are provided at an upper surface of the rotating portion 22. When a user operates the mode change switch 38 or 39, an emission mode of laser beam is set.

The handle 131 is gripped by a user when the user carries the laser marking device 1.

The external power source connector 132 is configured to be electrically couplable to an external power source.

[1-3. Laser Beam Generator]

As shown in FIG. 2A and FIG. 2B, the laser beam generator 13 includes a laser beam emitter 41 to emit a laser beam and an emission controller 42 to control laser beam emission by the laser beam emitter 41. The laser beam generator 13 is an example of an operation device of the present disclosure.

The laser beam emitter 41 includes a not-shown laser beam source that generates a laser beam by using supplied electric power, and a not-shown laser beam converter that includes a lens and other components. The lens converts the laser beam emitted from the laser beam source into a linear light. The laser beam emitter 41 emits, as linear lights, horizontal laser beams each indicating a horizontal reference line and vertical laser beams each indicating a vertical reference line. The laser beam emitter 41 emits four horizontal laser beams from the respective horizontal laser beam emission ports 33 and emits four vertical laser beams from the respective vertical laser beam emission ports 34. The laser beam emitter 41 may emit green laser beams in the present embodiment.

The emission controller 42 controls laser beam emission by the laser beam emitter 41 in accordance with a command from a user through the mode change switch 38 or 39. The emission controller 42 may include, for example, a microcomputer.

The rotating portion 22 also includes therein a coupling device 43, which is a power transmission cable. The coupling device 43 electrically couples the aforementioned terminals provided in the terminal holder 23 and the laser beam generator 13, to thereby supply electric power from the battery pack 15 electrically coupled to the aforementioned terminals to the laser beam generator 13. The coupling device 43 includes a bundle of cables. The cables are each an electric cable coated with resin. The bundle of cables has elasticity and flexibility and is easily deformable. Although the coupling device 43 of the present embodiment includes a plurality of cables, only one or two cables are indicated in the drawings.

[1-4. Battery Pack]

The battery pack 15 is a device to supply electric power. As shown in FIGS. 3A-3D, the battery pack 15 includes a housing 50 having a box shape. The housing 50 houses therein a not-shown battery cell, a temperature detection element to detect the temperature of the battery cell, a microcomputer to control charging and discharging, and other components.

Two slider pieces 51 extending in one direction are arranged in parallel to and spaced apart from each other on one surface of the housing 50. When attaching the battery pack 15 to the attachment portion 35, the slider pieces 51 slide on the sliding rails 36, and thereby the battery pack 15 moves in a horizontal direction. Accordingly, the battery pack 15 is guided to an attachment position at which electric power supply is enabled.

Between the slider pieces 51, five slits 52 to 56 are provided in parallel to the slider pieces 51. The slits 52 to 56 each have a length along longitudinal axes of the slider pieces 51. The slits 52 to 56 each have an open end so as to receive the terminals of the terminal holder 23 when the battery pack 15 is attached to the attachment portion 35.

Inside the slit 52, there is arranged a signal terminal 58 to be electrically coupled to a not-shown charger for charging the battery pack 15. Inside the slit 56, there is arranged a signal terminal 62 to be electrically coupled to the charger. Inside the slit 53, there is arranged a positive terminal 59 to allow charging and discharging of the battery cell. Inside the slit 55, there is arranged a negative terminal 61 to allow charging and discharging of the battery cell. Inside the slit 54 that is centrally located, there is arranged a temperature signal terminal 60.

[1-5. Terminal Holder]

As shown in FIGS. 4A-4C, the terminal holder 23 holds a first terminal 81, a second terminal 82, and a third terminal 83. The terminal holder 23 divides these terminals 81-83 into a section to be coupled to the battery pack 15 and a section to be coupled to the coupling device 43. Hereinafter, the section to be coupled to the battery pack 15 of the terminals 81-83 shown in FIG. 4A may be referred to simply as "obverse terminals," whereas the section to be coupled to the coupling device 43 shown in FIG. 4C may be referred to simply as "reverse terminals." The terminal holder 23 may include a single terminal, two terminals, or four or more terminals instead of the terminals 81-83.

The terminal holder 23 includes a main plate portion 71 having a substantially rectangular plate shape, a wall portion 73 connected to the main plate portion 71 and extending in a direction perpendicular to the main plate portion 71, and a sub plate portion 72 connected to an end of the wall portion 73 opposite to another end connected to the main plate portion 71 and extending in parallel to the main plate portion 71. The main plate portion 71 includes an area that overlaps the sub plate portion 72 and an area that does not overlap the sub plate portion 72. In other words, the main plate portion 71 and the sub plate portion 72 are arranged in mutually shifted positions in their extending directions.

The obverse terminals are arranged on one side of the wall portion 73, and the reverse terminals are arranged on the other side of the wall portion 73. Side wall portions 74, 75 are provided respectively at upper and lower ends of the sub plate portion 72 so as to cover the reverse terminals from above and below. Such configuration of the terminal holder 23 enables division between the obverse terminals and the reverse terminals.

The main plate portion 71 includes a thick plate with side surfaces, in which a groove 80 is provided all along an outer circumference of the main plate portion 71. Between the side wall portion 74 and the side wall portion 75, there are provided four section walls 76 to 79 that are parallel to the side wall portion 74 and the side wall portion 75 so as to divide the three terminals of the aforementioned reverse terminals.

In a state where the battery pack 15 is attached to the housing 11 by the sliding rails 36, the first terminal 81 contacts the positive terminal 59, the second terminal 82 contacts the temperature signal terminal 60, and the third terminal 83 contacts the negative terminal 61. The first terminal 81 and the third terminal 83 are coupled to the coupling device 43, and electric power of the battery pack 15 is supplied to the laser beam generator 13 through the coupling device 43.

[1-6. Attachment Portion]

As shown in FIGS. 4A-4C and FIGS. 5A-5D, the attachment portion 35 includes a first member 91 and a second member 92. The first member 91 is positioned at an upper part of the attachment portion 35 assembled to the rotating portion 22. The second member 92 is positioned at a lower part of the attachment portion 35 assembled to the rotating portion 22. The first member 91 and the second member 92 may be combined and mutually secured with screws 93. The attachment portion 35 is assembled to the rotating portion 22 with not-shown screw/screws and functions as a part of the housing 11.

The first member 91 includes a first wall surface 101 and a second wall surface 102. The first wall surface 101 extends in the up and down directions and the right and left directions. The second wall surface 102 is connected to an upper end of the first wall surface 101 and extends in the front and rear directions and the right and left directions. The first wall surface 101 includes a cutout 106 provided at a part of a lower end of the first wall surface 101.

The second member 92 includes a third wall surface 103 and a fourth wall surface 104. The third wall surface 103 extends in the up and down directions and the right and left directions. The fourth wall surface 104 is connected to a lower end of the third wall surface 103 and extends in the front and rear directions and the right and left directions. The third wall surface 103 includes a cutout 107 provided at a part of an upper end of the third wall surface 103.

When the first member 91 and the second member 92 are combined, a separator 105 is formed by the first wall surface 101, the second wall surface 102, the third wall surface 103, and the fourth wall surface 104. The separator 105 divides the housing 11 into a first area (or a first space) and a second area (or a second space) in the rotating portion 22 to which the attachment portion 35 is assembled. The laser beam generator 13 is located in the first area, and the terminal holder 23 is located in the second area.

The separator 105 includes a through hole 108 configured by the connected cutout 106 and cutout 107. The through hole 108 allows communication between the first area and the second area.

A waterproof tape 109 is applied to a boundary between the first wall surface 101 and the third wall surface 103. A projection 110 is provided along a periphery of the separator 105 of the attachment portion 35. The projection 110 circumferentially surrounds the separator 105 and projects forward.

Assembly of the attachment portion 35 to the rotating portion 22 will now be described. As shown in FIG. 6, the rotating portion 22 includes a rectangular opening 25. A recess 26 is provided at an outer surface of the rotating portion 22, and the recess 26 surrounding the opening 25 is concave inwardly of the rotating portion 22.

A rubber sheet 27 is provided to the recess 26. The rubber sheet 27 is a sheet-like rubber having a rectangularly annular shape. The opening 25 is surrounded by the rubber sheet 27 provided to the recess 26.

The attachment portion 35 is assembled to the rotating portion 22 with not-shown screw/screws so as to cover the opening 25. When the attachment portion 35 is assembled to the rotating portion 22, the rubber sheet 27 is held by the recess 26, and the projection 110 and its peripheral part as shown in FIG. 7.

A description will be given of a mounting structure of the terminal holder 23 in the attachment portion 35.

As shown in FIG. 5D, a first rib 111 and a second rib 112 are provided rearward of the third wall surface 103 in the second member 92. In FIG. 5D, the first rib 111 is positioned leftward and extends rightward. In FIG. 5D, the second rib 111 is positioned rightward and extends leftward. The terminal holder 23 is held in the right and left directions between the first rib 111 and the second rib 112 that are inserted in the groove 80 of the main plate portion 71. The first rib 111 and the second rib 112, which are also provided to the first member 91, hold the main plate portion 71 toward the right and left directions in the same manner as described above.

Figure 7:
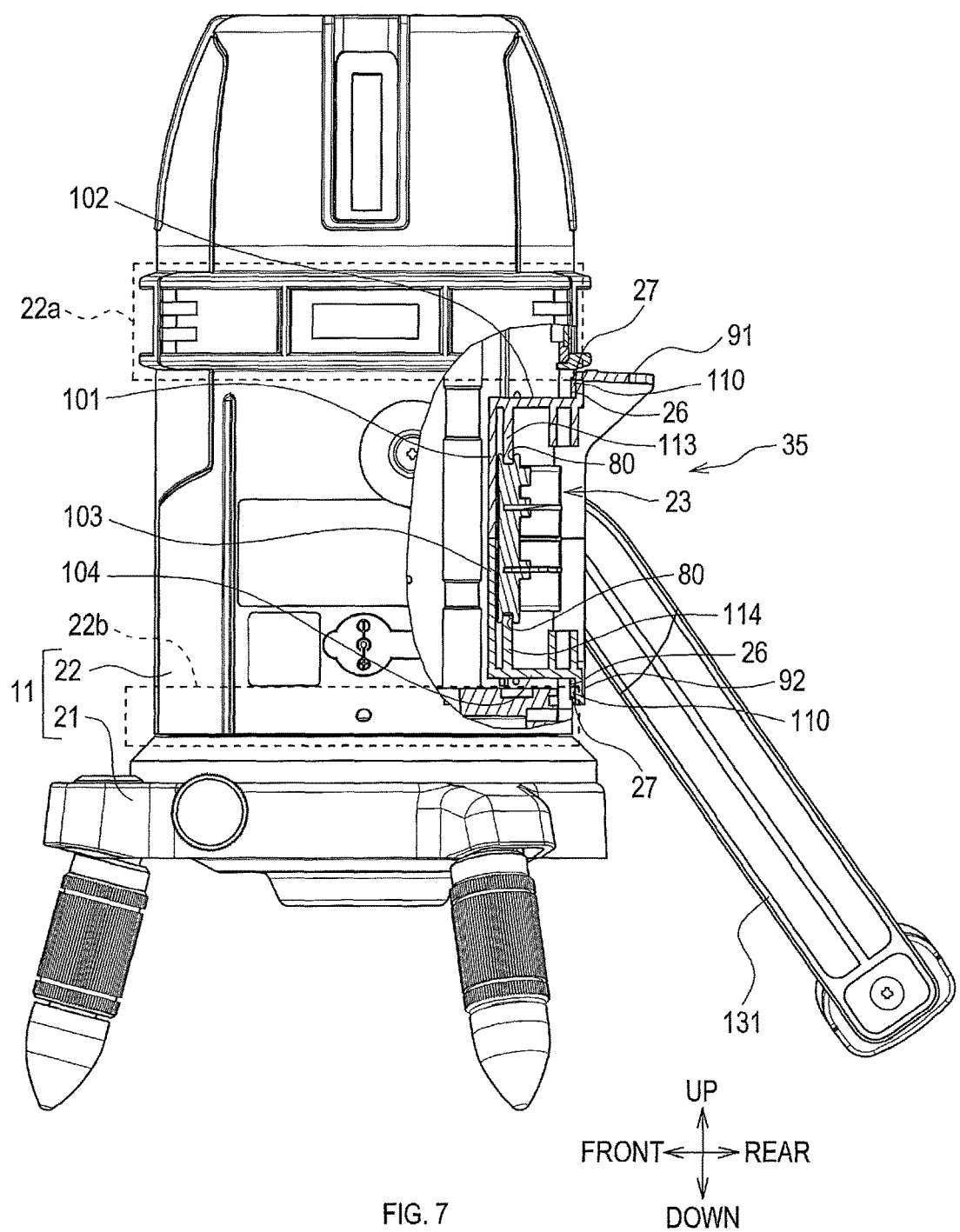
FIG. 7 is a partial VII-VII sectional view of FIG. 2A.

As shown in FIG. 7, a third rib 113 extending downward is provided rearward of the first wall surface 101 in the first member 91. A fourth rib 114 extending upward is provided rearward of the third wall surface 103 in the second member 92. The terminal holder 23 is held in the up and down directions between the third rib 113 and the fourth rib 114 that are inserted in the groove 80 of the main plate portion 71.

As described above, the terminal holder 23 is mounted to the attachment portion 35 by holding of the main plate portion 71 between the first rib 111 and the second rib 112, as well as between the third rib 113 and the fourth rib 114. The terminal holder 23 is mounted to the attachment portion 35 so as not to come off the attachment portion 35 but to have some freedom of movement relative to the attachment portion 35. Specifically, a distance between the first rib 111 and the second rib 112 is configured to be greater than a distance between a bottom of the groove 80 facing the first rib 111 and a bottom of the groove 80 facing the second rib 112 (in other words, a width of the main plate portion 71 in the right and left directions excluding depths of the groove 80 in the right and left directions). Also, a distance between the third rib 113 and the fourth rib 114 is configured to be greater than a distance between a bottom of the groove 80 facing the third rib 113 and a bottom of the groove 80 facing the fourth rib 114 (in other words, a width of the main plate portion 71 in the up and down directions excluding depths of the groove 80 in the up and down directions). Further, each of the first rib 111 to the fourth rib 114 has a thickness smaller than a width of the groove 80.

When the first member 91 and the second member 92 are not combined, the main plate portion 71 is not held toward the up and down directions between the third rib 113 and the fourth rib 114. Thus, the terminal holder 23 is attachable and detachable with respect to the first member 91 or the second member 92. That is, the first rib 111 to the fourth rib 114 can retain the terminal holder 23 when the first member 91 and the second member 92 are combined with each other to thereby form the separator 105. The first rib 111 to the fourth rib 114 are an example of a retainer of the present disclosure, and also examples of a plurality of members of the retainer.

Figure 8:
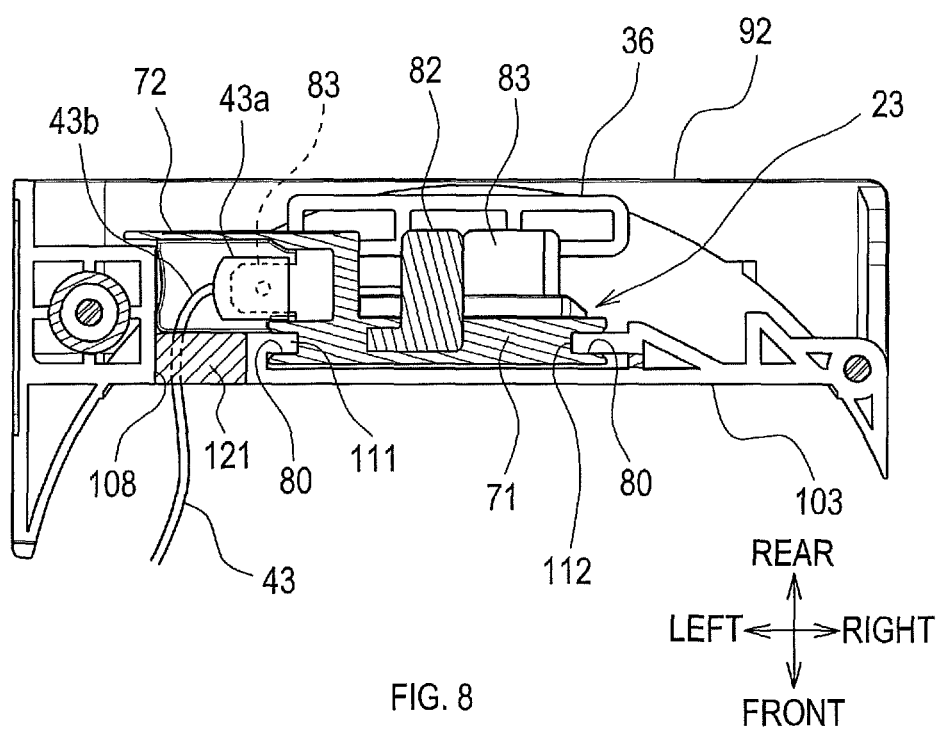
FIG. 8 is an explanatory view showing the attachment portion with a sealing material applied.

As shown in FIG. 8, the attachment portion 35, to which the terminal holder 23 is mounted, includes a sealing material 121 so as to seal the through hole 108 in a state where the coupling device 43 passes through the through hole 108. The sealing material 121 may include, for example, silicone resin or urethane resin, or may include a material other than resin. The sealing material 121 is an example of a sealing portion of the present disclosure.

A part of the coupling device 43 positioned within the through hole 108 is fixed with the sealing material 121 and thus is indisplaceable, whereas a leading end 43b of the coupling device 43 positioned between a cable terminal 43a to be coupled to the reverse terminals and the sealing material 121 is displaceable.

Figure 9:
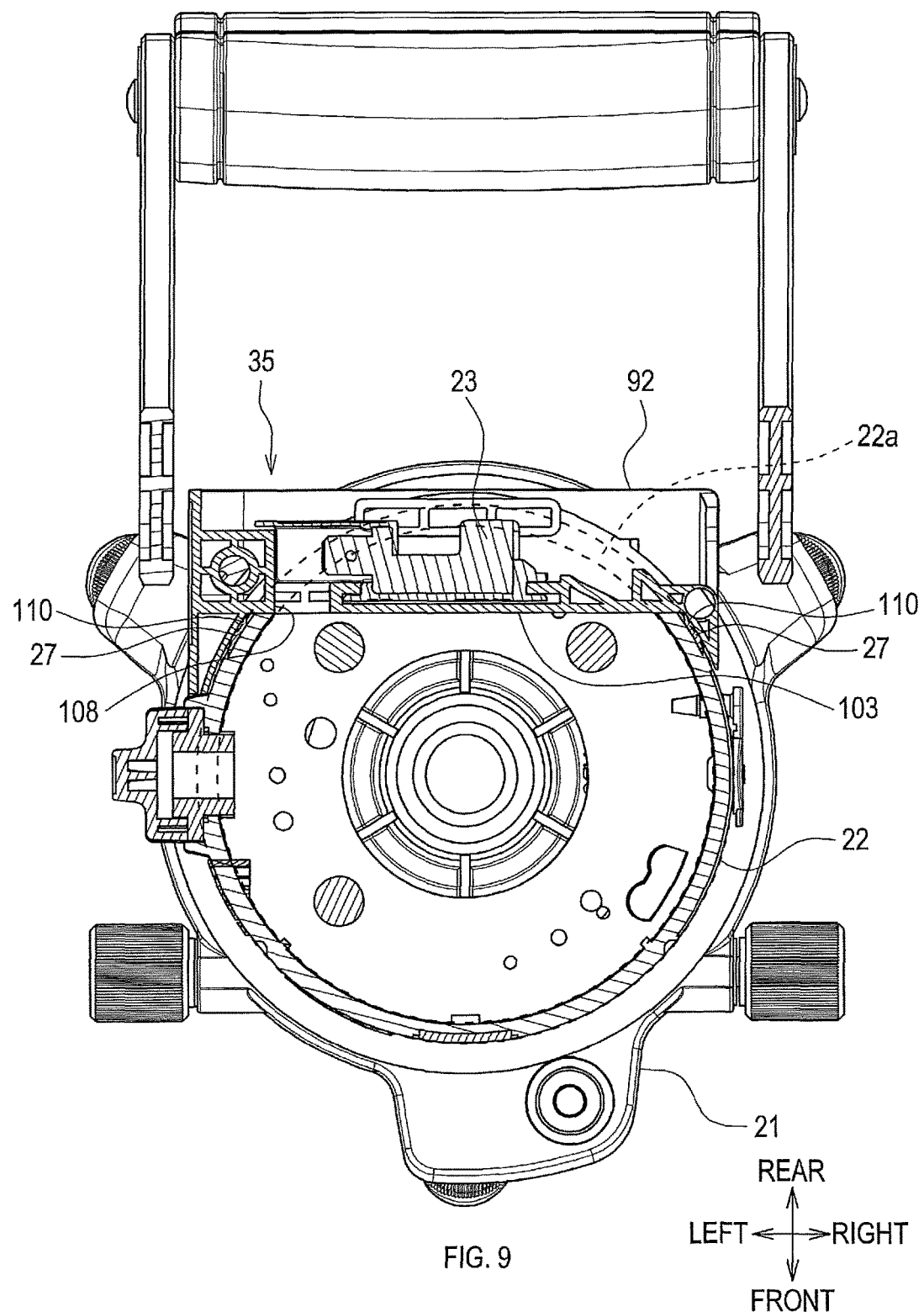
FIG. 9 is a IX-IX sectional view of FIG. 2A.

As shown in FIG. 7, the rotating portion 22 includes an upper cylindrical portion 22a above the attachment portion 35 and a lower cylindrical portion 22b below the attachment portion 35. The upper cylindrical portion 22a and the lower cylindrical portion 22b each include a main part having a substantially cylindrical shape. As shown in FIG. 9, when the housing 11 is projected onto a plane having a normal that coincides with a center axis of the upper cylindrical portion 22a (see the axis L1 in FIG. 1) and a center axis of the lower cylindrical portion 22b (see the axis L1 in FIG. 1), a part of the separator 105 including at least the third wall surface 103 is positioned inside the upper cylindrical portion 22a and inside the lower cylindrical portion 22b. In FIG. 9, the laser beam generator 13, the coupling device 43, the sealing material 121, for example, are not shown. Although not shown, the first wall surface 101 is also positioned inside the upper cylindrical portion 22a and inside the lower cylindrical portion 22b.

[1-7. Effects]

The above detailed embodiment may achieve the effects described below.

(1a) According to the laser marking device 1 of the present embodiment, the separator 105 separates the inside and outside of the rotating portion 22, and the sealing material 121 seals the through hole 108 of the separator 105. Accordingly, a route of invasion of foreign matter, such as water and dust, to the inside of the rotating portion 22 is blocked, and invasion of foreign matter can be reduced.

As shown in FIG. 5D and FIG. 7, when the terminal holder 23 is mounted to the attachment portion 35, a gap between the terminal holder 23 and the attachment portion 35 is small. Thus, invasion of large foreign matter can be reduced by the terminal holder 23. The waterproof tape 109 can reduce invasion of foreign matter between the first wall surface 101 and the third wall surface 103. The rubber sheet 27 held between the attachment portion 35 and the rotating portion 22 provides sealing between the attachment portion 35 and the rotating portion 22, and thus can reduce invasion of foreign matter between the attachment portion 35 and the rotating portion 22.

(1b) According to the laser marking device 1 of the present embodiment, when the first member 91 and the second member 92 are combined with each other, the terminal holder 23 can be retained at a specified position in the housing 11 with the first rib 111 to the fourth rib 114.

Also, the terminal holder 23 is mounted to the attachment portion 35 with some freedom of movement, and thus is movable within a small range relative to the attachment portion 35. When the battery pack 15 is attached to the attachment portion 35, the terminals 81, 82, 83 provided to the terminal holder 23 respectively contact the terminals 59, 60, 61 provided to the battery pack 15. Since the terminal holder 23 is movable, it is possible to reduce application of an excessive load on any terminal, and thus is possible to reduce occurrence of deformation or breakage of the terminals or surrounding parts.

Since the coupling device 43 is deformable, obstruction of movement of the terminal holder 23 by the coupling device 43 can be reduced.

(1c) According to the laser marking device 1 of the present embodiment, at least the first wall surface 101 and the third wall surface 103 of the separator 105 are positioned inside the upper cylindrical portion 22a and inside the lower cylindrical portion 22b. Accordingly, the terminal holder 23 and the battery pack 15 can be arranged so as to be close to the center axis L1 of the upper cylindrical portion 22a and the center axis L1 of the lower cylindrical portion 22b.

2. Other Embodiments

Although one embodiment of the present disclosure has been described as above, the present disclosure is not limited to the aforementioned embodiment, but may be practiced in various modified forms.

(2a) In the aforementioned embodiment, the laser marking device 1 is described as an example of a job-site electric apparatus. However, the technique of the present disclosure may be applied to any other job-site electric apparatuses used at various work sites, for example, of do-it-yourself carpentry, manufacturing, gardening, and construction. Specifically, the technique of the present disclosure may be applied, for example, to an electric working machine having an operation device configured to operate by receiving supply of electric power, such as an electric power tool for masonry work, metalworking, or woodworking, or a working machine for gardening, or an electric apparatus for preparing an environment of a work site. More specifically, the technique of the present disclosure may be applied to various job-site electric apparatuses, including an electric hammer, an electric hammer drill, an electric drill, an electric driver, an electric wrench, an electric grinder, an electric circular saw, an electric reciprocating saw, an electric jigsaw, an electric cutter, an electric chainsaw, an electric plane, an electric nailer (including an electric tacker), an electric hedge trimmer, an electric lawn mower, an electric lawn trimmer, an electric grass cutter, an electric cleaner, an electric blower, an electric sprayer, an electric spreader, an electric dust collector, a work light, or an audio device for work sites, such as a radio and a speaker.

The shape of each component in the terminal holder 23 and the housing 11 is not at all limited to the shape exemplified in the aforementioned embodiment.

(2b) In the aforementioned embodiment, the through hole 108 is sealed with the sealing material 121 including resin. However, the present disclosure is not limited to this example, and the through hole 108 through which the coupling device 43 passes may be sealed in any manner. For example, the through hole 108 may be sealed with a sponge-like member that is arranged within the through hole 108, or may be sealed with a sheet-like member, such as a tape.

In a case of using a windable member that is windable around the coupling device 43 in order to seal the through hole 108, the through hole 108 may be sealed in the following manner: the windable member may be previously wound around the coupling device 43, and then the first member 91 and the second member 92 may be combined such that the coupling device 43 can be held within the through hole 108. The windable member may be, for example, a sponge-like member, a sheet-like member, or a sealing material. When the windable member is held by a plurality of wall surfaces forming the through hole 108, good sealing of the through hole 108 can be achieved.

(2c) Although the first rib 111 to the fourth rib 114 are described as examples of members for the retainer to retain the terminal holder 23 in the aforementioned embodiment, the retainer is not limited to this configuration but may be configured to be capable of retaining the terminal holder 23 in any manner.

For example, a part of the first rib 111, a part of the second rib 112, and the third rib 113 may be provided to the first member 91. A part of the first rib 111, a part of the second rib 112, and the fourth rib 114 may be provided to the second member 92. Alternatively, all the members for the retainer may be arranged on any one of the first member 91 and the second member 92. In a case where the attachment portion 35 is configured with three or more members combined together, the members for the retainer may be individually arranged on the three or more members of the attachment portion 35.

The terminal holder 23 may be fixed to the attachment portion 35 using, for example, fasteners such as screws, instead of being retained to the attachment portion 35 through the main plate portion 71 held by the first rib 111 to the fourth rib 114.

Although the retainer may retain the terminal holder 23 with some freedom of movement by providing a clearance between the terminal holder 23 and the retainer, the retainer may be configured to retain the terminal holder 23 without freedom of movement. When providing a clearance between the terminal holder 23 and the retainer, a movable range of the terminal holder 23 may be set to 1 mm or less.

(2d) Although the coupling device 43 in the aforementioned embodiment includes cables having elasticity and flexibility and being deformable, the coupling device 43 is not limited to such cables. For example, the coupling device 43 may include a member with less elasticity or flexibility, such as a sheet-metal part or a metal bar member, as compared with cables.

The coupling device may provide movability of the terminal holder 23 by the configuration in which at least a part of the coupling device from the sealing portion, such as the sealing material 121, to the reverse terminals of the terminal holder 23 is deformable. That is, the entire coupling device need not be deformable as cables. At least a part of the shape of the coupling device may be changed depending on a load applied to the terminal holder 23 when the battery pack 15 is attached to the housing 11. At least a part of the coupling device may include a member that is unlikely to be broken despite repeated changes in shape.

(2e) Although the sliding rails 36 are described as an example of the mounting portion to attach the battery pack 15 to the housing 11 in the aforementioned embodiment, the battery pack may be held by a configuration other than the sliding rails 36. For example, the battery pack 15 may be attached to the housing 11 using a fastener such as a screw.

(2f) The reverse terminals provided to the terminal holder 23 may be subjected to water-proof treatment and/or dust-proof treatment. For example, a silicone resin, a urethane resin, and a moisture-proof material may be applied to surfaces of the reverse terminals. Water-proof treatment or dust-proof treatment is not limited to such example, but may be achieved in various manners.

What is claimed is:

1. A job-site electric apparatus comprising:
    a housing;
    an operation device configured to operate by receiving supply of electric power;
    a terminal configured to receive supply of the electric power from a battery pack;
    a separator configured to separate the housing into a first area and a second area, and including a through hole that allows communication between the first area and the second area, the first area including the operation device, and the second area including the terminal;
    a coupling device configured to pass through the through hole and electrically couple the terminal to the operation device; and
    a sealing portion configured to seal the through hole through which the coupling device passes.

2. The job-site electric apparatus according to claim 1, further comprising:
    a terminal holder configured to hold the terminal,
    wherein the housing is configured to retain the operation device and the terminal holder.

3. The job-site electric apparatus according to claim 2, wherein the terminal holder is configured to cover a part of the terminal.

4. The job-site electric apparatus according to claim 2, wherein the housing includes a retainer configured to retain the terminal holder at a specified position, and
    wherein the terminal holder is mounted to the housing by being retained by the retainer.

5. The job-site electric apparatus according to claim 4, wherein the separator includes a combination of a plurality of components.

6. The job-site electric apparatus according to claim 5, wherein the retainer includes a plurality of members, each member being provided to one component of the plurality of components, and
    wherein the plurality of members are combined to retain the terminal holder at the separator formed by the combination of the plurality of components.

7. The job-site electric apparatus according to claim 6, wherein the plurality of members are arranged in the second area and combined to retain the terminal holder at the separator formed by the combination of the plurality of components.

8. The job-site electric apparatus according to claim 2, wherein the terminal holder is mounted to the housing with some freedom of movement.

9. The job-site electric apparatus according to claim 2, wherein the housing is configured to retain the operation device in the first area and the terminal holder in the second area.

10. The job-site electric apparatus according to claim 1, wherein the coupling device includes a deformable part.

11. The job-site electric apparatus according to claim 10, wherein the deformable part includes a part of a section from the sealing portion to the terminal.

12. The job-site electric apparatus according to claim 1, wherein the housing includes a mounting portion configured to attachably and detachably hold the battery pack.

13. The job-site electric apparatus according to claim 1, wherein the housing includes a cylindrical portion having a substantially cylindrical shape.

14. The job-site electric apparatus according to claim 13, wherein the separator is provided in the housing such that when the housing is projected onto a plane having a normal that coincides with an axis of the cylindrical portion, a part of the separator is positioned inside the cylindrical portion.

15. A method for reducing invasion of foreign matter into a job-site electric apparatus, the method comprising:
    providing a separator in a housing of the job-site electric apparatus so as to separate the housing into a first area and a second area, the first area including an operation device of the job-site electric apparatus configured to operate by receiving supply of electric power, the second area including a terminal configured to receive supply of electric power from a battery pack, and the separator including a through hole that allows communication between the first area and the second area;
    electrically coupling the terminal to the operation device through the through hole; and
    sealing the through hole through which the terminal and the operation device are electrically coupled.

* * * * *